(12) United States Patent
Lim

(10) Patent No.: US 7,663,233 B2
(45) Date of Patent: Feb. 16, 2010

(54) PAD PART OF SEMICONDUCTOR DEVICE HAVING OPTIMAL CAPACITANCE BETWEEN PINS

(75) Inventor: Dong Ju Lim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 137 days.

(21) Appl. No.: 11/678,114

(22) Filed: Feb. 23, 2007

(65) Prior Publication Data

US 2007/0205511 A1    Sep. 6, 2007

(30) Foreign Application Priority Data

Feb. 24, 2006   (KR) ...................... 10-2006-0018180

(51) Int. Cl.
*H01L 23/48* (2006.01)
*H04N 5/335* (2006.01)

(52) U.S. Cl. ................. 257/734; 257/E23.02; 257/784; 257/774; 257/532; 257/728; 257/758; 257/E27.132

(58) Field of Classification Search ............ 257/E23.02, 257/734, 784, 786, 774, 773, 528, 532, 758, 257/741, E27.132

See application file for complete search history.

(56) References Cited

U.S. PATENT DOCUMENTS

| | | | | |
|---|---|---|---|---|
| 6,342,416 B1* | 1/2002 | Kim et al. | ..................... | 438/239 |
| 6,384,442 B1* | 5/2002 | Chen | ......................... | 257/298 |
| 6,392,917 B1* | 5/2002 | Kang | ......................... | 365/145 |
| 6,436,762 B1* | 8/2002 | Tzeng et al. | ................. | 438/253 |
| 6,809,364 B2* | 10/2004 | Matsuoka et al. | ........... | 257/296 |
| 7,084,949 B2* | 8/2006 | Washizawa et al. | ......... | 349/187 |
| 7,126,206 B2* | 10/2006 | Piasecki | ...................... | 257/532 |
| 7,166,882 B2* | 1/2007 | Nakamura et al. | .......... | 257/306 |
| 2003/0054600 A1* | 3/2003 | Uchiyama | ................... | 438/200 |
| 2004/0021159 A1* | 2/2004 | Matsuoka et al. | ........... | 257/296 |
| 2005/0218440 A1* | 10/2005 | Park | ........................... | 257/298 |
| 2006/0278901 A1* | 12/2006 | Dangelo et al. | ............. | 257/276 |
| 2007/0050743 A1* | 3/2007 | Batra | .......................... | 716/10 |
| 2007/0114606 A1* | 5/2007 | Hoshino et al. | ............. | 257/341 |
| 2007/0177044 A1* | 8/2007 | Maruyama et al. | .......... | 348/308 |
| 2007/0207579 A1* | 9/2007 | Omura | ....................... | 438/253 |
| 2008/0099812 A1* | 5/2008 | Nagata et al. | ............... | 257/298 |

FOREIGN PATENT DOCUMENTS

| | | |
|---|---|---|
| JP | 2003-309182 A | 10/2003 |
| KR | 1020020085223 A | 11/2002 |
| KR | 1020050087154 A | 8/2005 |
| KR | 1020070003243 A | 1/2007 |

* cited by examiner

*Primary Examiner*—Alexander O Williams
(74) *Attorney, Agent, or Firm*—Ladas & Parry LLP

(57) ABSTRACT

A pad part of a semiconductor device includes a semiconductor substrate having a pad forming region; a plurality of dot type stack patterns with a dielectric layer and a conductive layer for option capacitors, formed in the pad forming region and arranged at regular intervals; a first interlayer dielectric formed on the semiconductor substrate to cover the stack patterns; first metal lines formed on the first interlayer dielectric to be connected to the stack patterns arranged in diagonal directions; a second interlayer dielectric formed on the first interlayer dielectric to cover the first metal lines; second metal lines formed on the second interlayer dielectric to be brought into contact with the first metal lines; a pad formed on the second interlayer dielectric; and option metal lines formed on the second interlayer dielectric to connect the second metal lines and the pad to each other.

10 Claims, 4 Drawing Sheets

PAD PART OF SEMICONDUCTOR DEVICE HAVING OPTIMAL CAPACITANCE BETWEEN PINS

CROSS-REFERENCE TO RELATED APPLICATIONS

The present application claims priority to Korean patent application number 10-2006-0018180 filed on Feb. 24, 2006, which is incorporated herein by reference in its entirety.

BACKGROUND OF THE INVENTION

The present invention relates to a pad part of a semiconductor device, and more particularly, to a pad part of a semiconductor device that has option capacitors for the fine adjustment of capacitance between pins.

In general, a pin in a semiconductor package indicates a lead, which is connected to a pad of a semiconductor chip, and functions to electrically connect the semiconductor chip to an external substrate.

A typical example of a semiconductor package generally known in the conventional art is shown in FIG. 1.

FIG. 1 is a cross-sectional view illustrating a conventional semiconductor package. Referring to FIG. 1, a semiconductor chip 10 is attached to a die paddle 12 by an adhesive (not shown), and inner leads 14a are electrically connected to the pads 11 of the semiconductor chip 10 by metal wires 13. The semiconductor chip 10, the die paddle 12, the metal wires 13, and the inner leads 14a are molded using a molding material (not shown), such as an epoxy molding compound (EMC). Outer leads 14b, which project out of the molding material, are connected to the electrode terminals of the substrate, such as a printed circuit board (PCB). The reference numeral 15 designates a lead frame.

In the semiconductor package, the leads 14a and 14b connected to the pads 11 of the semiconductor chip 10 have different capacitance values due to: first, a difference in the doping concentration between junction areas, and a difference in the thickness between gate electrodes, etc.; and, second, a difference in the lengths and widths of the metal wires 13 and the leads 14a and 14b connected to the respective pads 11.

The different capacitance between pins creates variances in signal transmission times, and this problem is regarded as significant impediment against the trend toward high speed operations of the highly integrated components of the semiconductor device.

Therefore, the development of new manufacturing methods has focused on methods of reducing the capacitance-difference between pins. In the conventional art, option transistors are formed adjacent to the pads or option capacitors are formed under the pads.

Separate transistors can be formed in electrostatic discharge (ESD) elements connected to pads to function as option transistors. The capacitance values between pins can be adjusted by varying the number of option transistors that are connected to the respective pads.

Regarding the option capacitors formed under the pads, a gate oxide layer pattern acting as a dielectric layer and a gate conductive layer pattern acting as an upper electrode are sequentially formed in the pad region of the semiconductor substrate when forming gates in a cell region. The option capacitors, each of which comprising a stack of substrate, gate oxide layer, and gate conductive layer, are formed. The capacitance values between pins is adjusted by connecting the requisite number of option capacitors to the respective pads in the same manner as described above.

The methods of forming the option transistors and forming the option capacitors may be used together. In general, the capacitance change rate by the option capacitors is relatively finer when compared to a capacitance change rate by the option transistors.

FIG. 2 shows a layout of a conventional semiconductor device in which option capacitors are formed under pads.

Referring to FIG. 2, conventional stack patterns 250 for option capacitors are formed under the pad 280 of a semiconductor device. Each stack pattern 250 has the sectional shape of a bar with the major axis extending in the direction of the "X-axis" as shown in FIG. 2. The stack patterns 250 are parallel to each other and spaced at regular intervals. The stack patterns 250 for option capacitors are connected to the pad 280 through first metal lines M1, second metal lines M2, and option metal lines O/M. The second metal lines M2, the option metal lines O/M and the pad 280 are formed on the same layer.

In FIGS. 2-3, reference numeral 200 designates a quadrangular semiconductor substrate; M1C designates first contacts that connect the stack patterns 250 for option capacitors and the first metal lines M1 to each other; M2C designates second contacts that connect the first metal lines M1 and the second metal lines M2 to each other; and 220 designates a pick-up that is shaped like a picture frame and surrounds the quadrangular pad part. The pick-up 220 is connected to a ground line (VSS) and functions to apply a bias to the pad part of the semiconductor device although this connection is not shown in FIG. 3.

FIG. 3 is a cross-sectional view taken along the line a-a' of FIG. 2. The pad part of the semiconductor device having the conventional option capacitors includes the semiconductor substrate 200 with a pad forming region; an isolation structure 210 located in the pad forming region of the semiconductor substrate 200; the stack patterns 250 for option capacitors, each of which is shaped like a bar and comprises a stack of a gate insulation layer 230 and a gate conductive layer 240; a first interlayer dielectric 260 that covers the stack patterns 250 for option capacitors' the first contacts M1C, which are formed in the first interlayer dielectric 260, that contact the stack patterns 250 for option capacitors; the first metal lines M1 formed on the first interlayer dielectric 260 and connected to the first contacts M1C; a second interlayer dielectric 270 formed on the first interlayer dielectric 260 that covers the first metal lines M1; the second contacts M2C formed in the second interlayer dielectric 270 that contact the first metal lines M1; the second metal lines M2 formed on the second interlayer dielectric 270 that connect to the second contacts M2C; and the option metal lines O/M that connect the second metal lines M2 and the pad 280 to each other.

In the pad part of the semiconductor device constructed as described above, if a bias is applied to the gate conductive layer 240 and the pick-up 220, the semiconductor substrate 200, the isolation structure 210, the gate insulation layer 230, and the gate conductive layer 240 serve as a capacitor. At this time the capacitance value varies depending upon the number of stack patterns 250 for option capacitors that are connected to the pad 280 by the option metal lines O/M and the size of each stack pattern 250 for option capacitors.

In this regard, a finely tuned method for adjusting capacitance between pins is needed for a highly-integrated and high-speed semiconductor device due to the decrease in the desired pin capacitance and delta capacitance (ΔC).

However, in the conventional method for adjusting capacitance between pins, which uses the option capacitors as described above, since the capacitance adjustment rate by the option capacitors reaches several tens farads (F), it is difficult to finely adjust capacitance.

SUMMARY OF THE INVENTION

An embodiment of the present invention is directed to a pad part of a semiconductor device that has option capacitors for more fine adjustment of capacitance between pins when compared to the conventional art.

In an embodiment, the pad part of a semiconductor device comprises a semiconductor substrate having a pad forming region; a plurality of dot type stack patterns for option capacitors, with a dielectric layer and a conductive layer, formed in the pad forming region of the semiconductor substrate and arranged at regular intervals; a first interlayer dielectric formed on the semiconductor substrate that covers the stack patterns; first metal lines, formed on the first interlayer dielectric in the pad forming region, connected to the stack patterns, which are arranged in diagonal directions; a second interlayer dielectric formed on the first interlayer dielectric that covers the first metal lines; second metal lines, formed on the second interlayer dielectric, to be brought into contact with the first metal lines; a pad located on the second interlayer dielectric which is separated from the second metal lines; and option metal lines located on the second interlayer dielectric that connect the second metal lines to the pad.

The pad part of the semiconductor device further comprises an isolation structure formed in the pad forming region of the semiconductor substrate; and a pick-up that surrounds the isolation structure and connects to a ground line.

The pick-up has the sectional shape of a picture frame.

The semiconductor substrate comprises a p-type substrate or a substrate that is formed with a p-type diffusion area on the surface of the pad forming region.

The stack pattern has a square or rectangular sectional shape having an area of 35~100 μm².

The second metal lines are respectively brought into contact with both ends of the first metal lines.

The pad part of the semiconductor device further comprises first contacts, formed in the first interlayer dielectric, that connect the stack patterns for option capacitors to the first metal lines.

Two first contacts are formed for each stack pattern.

The pad part of a semiconductor device further comprises second contacts formed in the second interlayer dielectric to connect the first metal lines to the second metal lines.

Two second contacts are formed for each end of the first metal line.

DESCRIPTION OF SPECIFIC EMBODIMENTS

In the present invention, a plurality of dot type stack patterns for option capacitors is regularly located. The dot type stack patterns, which are arranged in diagonal directions, are connected to one another by a plurality of first metal lines. In this case, the number of stack patterns that are brought into contact with the respective first metal lines are different, when compared to the conventional art, thereby allowing for the fine adjustment of capacitance between pins.

Therefore, since the present invention allows for the adjustment of capacitance between pins, it is possible to prevent the difference in pin capacitance from causing degradation of the semiconductor device's operational characteristics.

Figure 1:
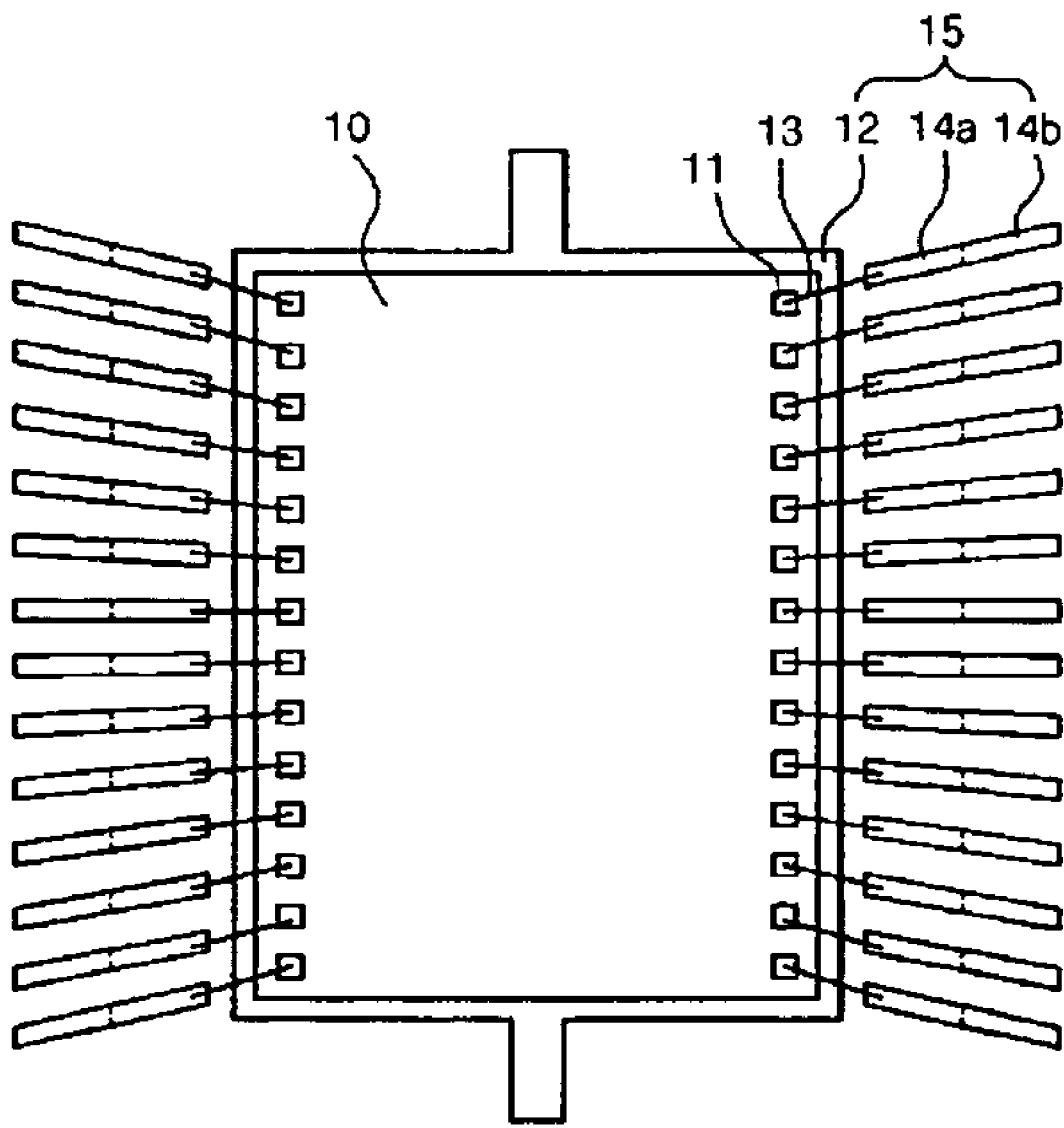
FIG. 1 is a view illustrating the layout of a semiconductor device manufactured according to the conventional art.
Figure 2:
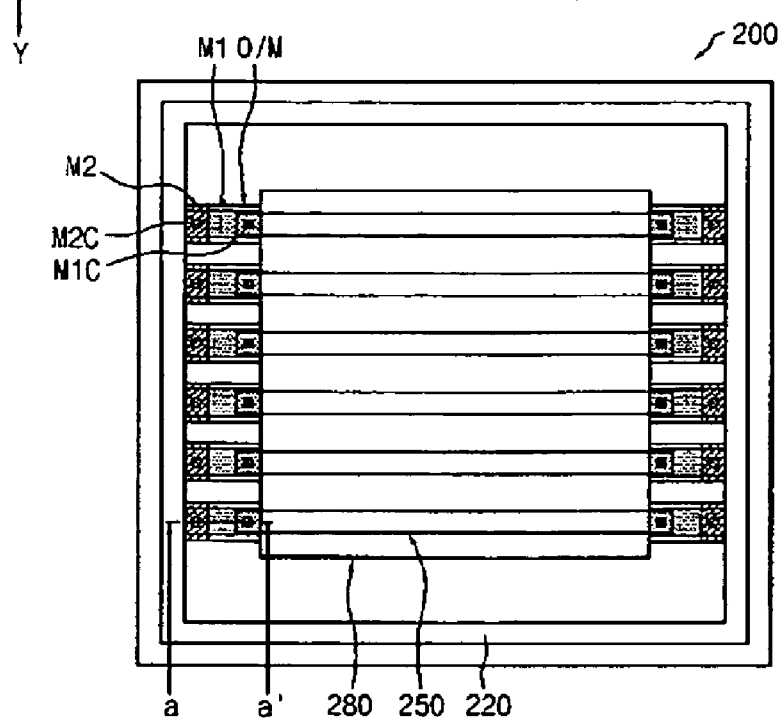
FIG. 2 is a view illustrating the layout of a pad part of the semiconductor device manufactured according to the conventional art.
Figure 3:
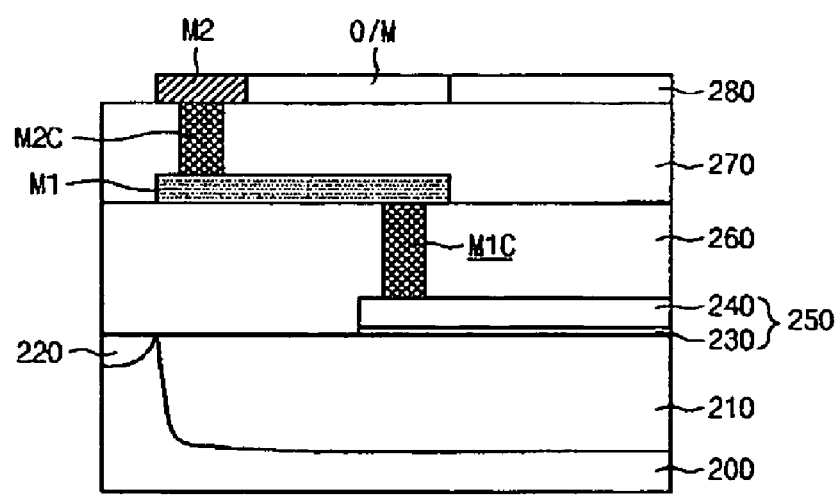
FIG. 3 is a cross-sectional view taken along the line a-a' of FIG. 2.
Figure 4:
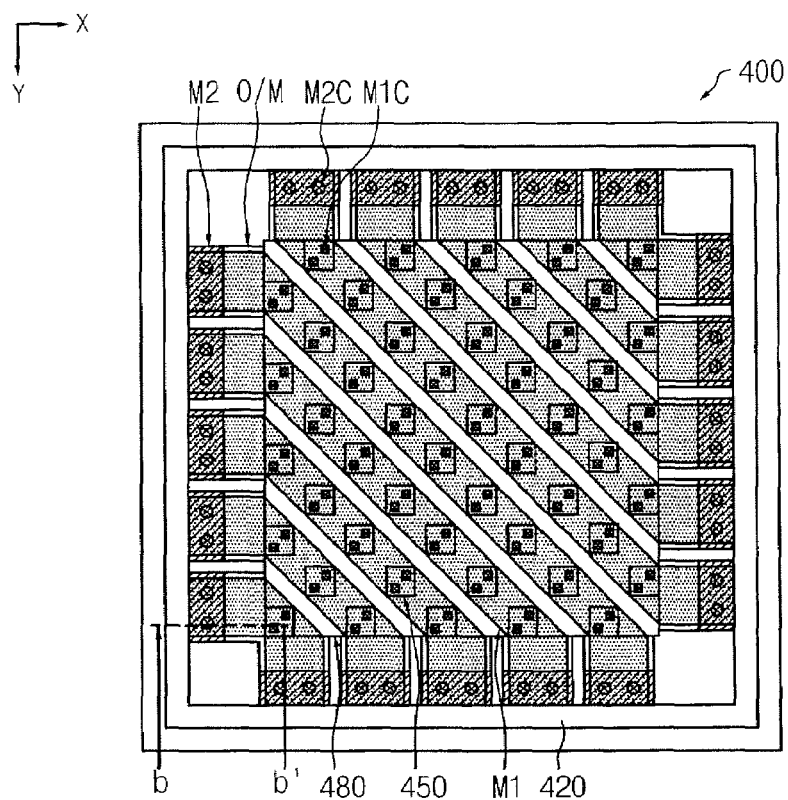
FIG. 4 is a view illustrating the layout of a pad part of a semiconductor device manufactured in accordance with a first embodiment of the present invention.
Figure 5:
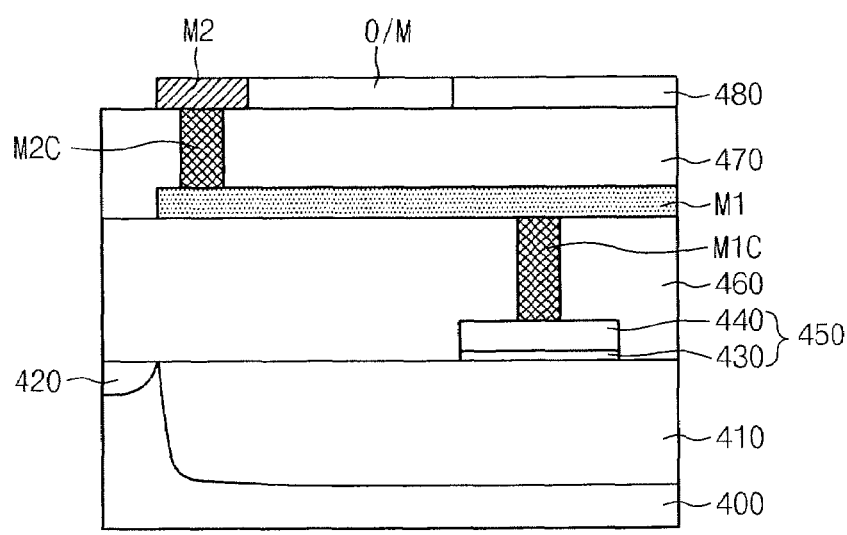
FIG. 5 is a cross-sectional view taken along the line b-b' of FIG. 4.

Detailed descriptions will be given below with reference to FIGS. 4 and 5 wherein FIG. 4 is a view illustrating the layout of the pad part of a semiconductor device manufactured in accordance with a first embodiment of the present invention, and FIG. 5 is a cross-sectional view taken along the line b-b' of FIG. 4.

A pad part of a semiconductor device in accordance with a first embodiment of the present invention includes a semiconductor substrate 400 with a quadrangular pad forming region. A plurality of dot type stack patterns 450 for option capacitors, each of which comprises a gate insulation layer 430 and a gate conductive layer 440, are formed in the pad forming region of the semiconductor substrate 400 and are arranged at regular intervals. A first interlayer dielectric 460 is formed on the semiconductor substrate 400 to cover the stack patterns 450. A plurality of first metal lines M1 are formed on the first interlayer dielectric 460 and connect to the stack patterns 450, which are arranged in diagonal directions in the pad forming region. The connection between the stack patterns 450 and the first metal lines M1 is implemented by first contacts M1C, which are formed in the first interlayer dielectric 460. Two first contacts M1C are formed for each stack pattern 450.

A second interlayer dielectric 470 is formed on the first interlayer dielectric 460 to cover the first metal lines M1. Second metal lines M2 are formed on the second interlayer dielectric 470 and are brought into contact with the first metal lines M1. At this time, the second metal lines M2 are formed to be respectively brought into contact with both ends of the first metal lines M1. The connection between the first metal lines M1 and the second metal lines M2 is implemented by second contacts M2C, which are formed in the second interlayer dielectric 470. Similar to the first contacts M1C, two second contacts M2C are formed for each end of the first metal line M1C. A quadrangular pad 480 is formed on the second interlayer dielectric 470 to be separated from the second metal lines M2. Option metal lines O/M are formed on portions of the second interlayer dielectric 470 between the second metal lines M2 and the pad 480 to connect the second metal lines M2 to the pad 480.

An isolation structure 410 is formed in the pad forming region of the semiconductor substrate 400, and a pick-up 420 is formed with the sectional shape of a picture frame and surrounds the isolation structure 410. At this time, the first and second metal lines M1 and M2 connects the pick-up 420 to a ground line (VSS).

In the pad part of a semiconductor device according to an embodiment of the present invention, the semiconductor substrate 400 comprises a p-type substrate or a substrate that is formed with a p-type diffusion area on the surface of the pad forming region. The gate insulation layer 430 and the gate conductive layer 440 respectively serve as a dielectric layer and a conductive layer for an option capacitor. The stack pattern 450 of the gate insulation layer 430 and the gate conductive layer 440 constitutes the option capacitor in cooperation with the semiconductor substrate 400. The stack pattern 450 is formed into a square (6 μm×6 μm or 10 μm×10 μm) or rectangular sectional shape of an area of 35~100 μm².

As described above, in the first embodiment of the present invention, each of the stack patterns for option capacitors, comprised of the dielectric layer and the conductive layer, is formed into a dot type, and the dot type stack patterns, which are arranged in respective diagonal directions, are connected to one another by the first metal lines.

In this case, depending upon the position where the first metal line is formed, the number of the stack patterns, which are connected to the first metal line, varies. As shown in FIG. 4, in the case of the first metal line M1 that diagonally extends from one corner to the opposite corner of the pad part, that is, across the center portion of the pad part, the first metal line M1 is connected with nine stack patterns 450. The number of the stack patterns 450, which are connected with the first metal line M1, gradually decreases from the center portion toward the periphery of the pad part. Adjacent to the periphery of the pad part, only one metal line M1 is connected to one stack pattern 450. The number of the stack patterns 450 connected to the respective first metal lines M1 when viewed from one periphery through the center portion to the other periphery of the pad part sequentially becomes 1, 3, 5, 7, 9, 9, 7, 5, 3 and 1 as this is shown in FIG. 4.

Accordingly, in an embodiment of the present invention, the number of stack patterns for option capacitors that are connected to the pad can be changed from 1 to 50 depending upon the connections of the option metal lines. For example, if it is necessary to connect two stack patterns for option capacitors to the pad, the option metal lines can be formed such that only the two first metal lines formed on both peripheries are connected to the pad.

In the conventional art, each of the stack patterns for option capacitors is formed to have the sectional shape of a bar with an area greater than 80 μm². However, in an embodiment of the present invention, each of the stack patterns for option capacitors is formed as a dot type with an area of about 64 μm², and the stack patterns are connected to one another in diagonal directions. Consequently, in an embodiment of the present invention, the capacitance change rate is decreased by 20% or more when compared to the conventional art.

Thus, in the pad part of a semiconductor device having option capacitors according to the first embodiment of the present invention, capacitance between pins can be more finely adjusted when compared to the conventional art, thereby preventing the differences in pin capacitance from causing degradation of operational characteristics.

Figure 6:
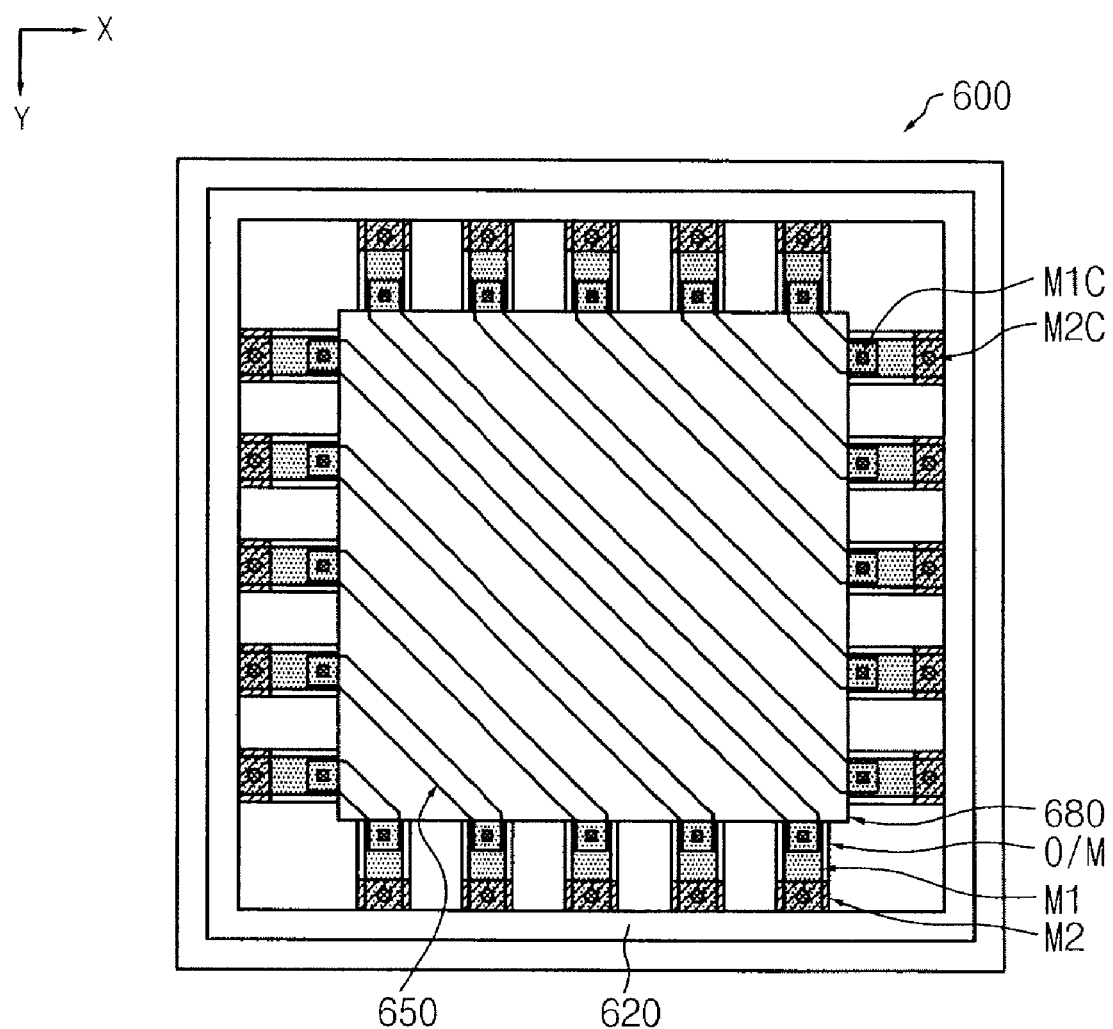
FIG. 6 is a view illustrating the layout of a pad part of a semiconductor device manufactured in accordance with a second embodiment of the present invention.

FIG. 6 is a view illustrating the layout of a pad part of a semiconductor device manufactured in accordance with a second embodiment of the present invention.

Referring to FIG. 6, a pad part of a semiconductor device in accordance with a second embodiment of the present invention includes a semiconductor substrate 600, which has a quadrangular pad forming region. A plurality of stack patterns 650 for option capacitors, each comprised of a gate insulation layer and a gate conductive layer (that is, comparable to the gate insulation layer 430 and the gate conductive layer 440 as shown in FIG. 4), are formed in the quadrangular pad forming region of the semiconductor substrate such that they are arranged in diagonal directions. A first interlayer dielectric (not shown) is formed to cover the stack patterns 650, and a plurality of first metal lines M1 are formed to connect to both ends of the stack patterns 650. A second interlayer dielectric (not shown) is formed on the first interlayer dielectric to cover the first metal lines M1. Second metal lines M2 are formed on the second interlayer dielectric to be brought into contact with the first metal lines M1, and a pad 680 is formed on the second interlayer dielectric to be separated from the second metal lines M2. Option metal lines O/M are formed on portions of the second interlayer dielectric between the second metal lines M2 and the pad 680 to connect the second metal lines M2 to the pad 680.

An isolation structure (not shown) is formed in the pad forming region of the semiconductor substrate 600, and a pick-up 620 is formed such that it has the sectional shape of a picture frame that surrounds the isolation structure. At this time, the pick-up 620 is formed to connect to a ground line (VSS) by the first and second metal lines M1 and M2.

In this second embodiment of the present invention as well, due to the diagonal arrangement of the stack patterns for option capacitors, according to the same principle as the aforementioned first embodiment, capacitance between pins can be more finely adjusted when compared to the conventional art, thereby preventing degradation of operational characteristics due to a difference in pin capacitance.

As is apparent from the above description, in the present invention, dot type stack patterns for option capacitors, which are formed under a pad, are composed of a gate insulation layer and a gate conductive layer, are regularly located, and are connected to one another by a plurality of first metal lines which are arranged in diagonal directions, such that the number of stack patterns brought into contact with the respective first metal lines varies. Accordingly, in the present invention, when compared to the conventional art, it is possible to more finely adjust capacitance between pins. As a consequence, in the present invention, because it is possible to prevent the degradation of operational characteristics of a semiconductor device due to a difference in pin capacitance, the characteristics of the semiconductor device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A pad part of a semiconductor device, comprising:
   a semiconductor substrate having a pad forming region;
   a plurality of dot type stack patterns of a dielectric layer and a conductive layer for option capacitors, formed in the pad forming region of the semiconductor substrate, and arranged at regular intervals;
   a first interlayer dielectric formed on the semiconductor substrate to cover the stack patterns;
   first metal lines formed on the first interlayer dielectric in the pad forming region to be connected to the stack patterns, which are arranged in diagonal directions;
   a second interlayer dielectric formed on the first interlayer dielectric to cover the first metal lines;
   second metal lines formed on the second interlayer dielectric to be brought into contact with the first metal lines;
   a pad formed on the second interlayer dielectric to be separated from the second metal lines; and
   option metal lines formed on the second interlayer dielectric to connect the second metal lines and the pad to each other.

2. The pad part as set forth in claim 1, further comprising:
an isolation structure formed in the pad forming region of the semiconductor substrate; and
a pick-up formed to surround the isolation structure and connected to a ground line.

3. The pad part as set forth in claim 2, wherein the pick-up has the sectional shape of a picture frame.

4. The pad part as set forth in claim 1, wherein the semiconductor substrate comprises a p-type substrate or a substrate that is formed with a p-type diffusion area on a surface of the pad forming region.

5. The pad part as set forth in claim 1, wherein the stack pattern has a square or rectangular sectional shape having an area of 35~100 $\mu m^2$.

6. The pad part as set forth in claim 1, wherein the second metal lines are formed to be respectively brought into contact with both ends of the first metal lines.

7. The pad part as set forth in claim 1, further comprising:
first contacts formed in the first interlayer dielectric to connect the stack patterns for option capacitors and the first metal lines to each other.

8. The pad part as set forth in claim 7, wherein two first contacts are formed for each stack pattern.

9. The pad part as set forth in claim 1, further comprising:
second contacts formed in the second interlayer dielectric to connect the first metal lines and the second metal lines to each other.

10. The pad part as set forth in claim 9, wherein two second contacts are formed for each end of the first metal line.

* * * * *